(12) United States Patent
LaMeres et al.

(10) Patent No.: US 7,183,781 B2
(45) Date of Patent: Feb. 27, 2007

(54) INCORPORATION OF ISOLATION RESISTOR(S) INTO PROBES USING PROBE TIP SPRING PINS

(75) Inventors: Brock J. LaMeres, Colorado Springs, CO (US); Brent Holcombe, Colorado Springs, CO (US); Glenn Wood, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/918,285

(22) Filed: Aug. 13, 2004

(65) Prior Publication Data

US 2006/0033514 A1    Feb. 16, 2006

(51) Int. Cl.
    *G01R 31/02* (2006.01)
(52) U.S. Cl. .................................... 324/754
(58) Field of Classification Search ................ 324/754, 324/756, 757, 761, 762, 765, 158.1; 174/262; 361/760, 772–773
    See application file for complete search history.

(56) References Cited

U.S. PATENT DOCUMENTS

| | | | |
|---|---|---|---|
| 4,883,443 A | | 11/1989 | Chase |
| 6,462,570 B1 * | | 10/2002 | Price et al. .................. 324/754 |
| 6,469,530 B1 * | | 10/2002 | Johnson et al. .............. 324/754 |
| 6,512,389 B1 * | | 1/2003 | Kocher ........................ 324/755 |
| 6,570,399 B2 * | | 5/2003 | Yeghiayan et al. .......... 324/761 |
| 6,624,647 B2 * | | 9/2003 | Adams et al. ............... 324/755 |
| 6,756,797 B2 * | | 6/2004 | Brandorff et al. ........... 324/754 |
| 6,778,198 B2 * | | 8/2004 | Dances ........................ 347/148 |

OTHER PUBLICATIONS

Brent A. Holcombe, et al., Connector-Less Probe, U.S. Appl. No. 10/373,820, filed Feb. 25, 2003.
Brent A. Holcombe, et al., "Alignment/Retention Device for Connector-Less Probe", U.S. Appl. No. 10/644,365, filed Aug. 20, 2003.
Brock J. LaMeres, et al., "Backside Attach Probe, Components thereof, and Methods for Making and Using Same", U.S. Appl. No. 10/902,405, filed on Jul. 28, 2004.
Brock J. LaMeres, et al., "Probes with Perpendicularly Disposed Spring Pins, and Methods of Making and Using Same", U.S. Appl. No. 10/781,086, filed Feb. 17, 2004.

* cited by examiner

*Primary Examiner*—Ha Tran Nguyen
*Assistant Examiner*—Tung X. Nguyen

(57) ABSTRACT

An isolation resistor is incorporated into the plunger of a probe tip spring pin by, for example, doping a ceramic that is used to form the plunger, or forming the plunger of first and second electrically coupled materials, at least a first of which has a resistivity sufficient to serve as an isolation resistor. Alternately, an isolation resistor is embedded in a printed circuit board trace that is used to couple either an upper or lower blind plated hole to a via. A probe tip spring pin is then inserted into the upper blind plated hole.

9 Claims, 2 Drawing Sheets

| Signal | ⬜ | 400 |
| Dielectric | ⬜ | 402 |
| Signal | ⬜ | 404 |
| Dielectric | ⬜ | 406 |
| Signal | ⬜ | 408 |
| Dielectric | ⬜ | 410 |
| Signal | ⬜ | 412 |
| Dielectric | ⬜ | 414 |
| Signal | ⬜ | 416 |
| Dielectric | ⬜ | 418 |
| Signal | ⬜ | 420 |
| Dielectric | ⬜ | 422 |
| Signal | ⬜ | 424 |
| Dielectric | ⬜ | 426 |
| Signal | ⬜ | 428 |
FIG. 4
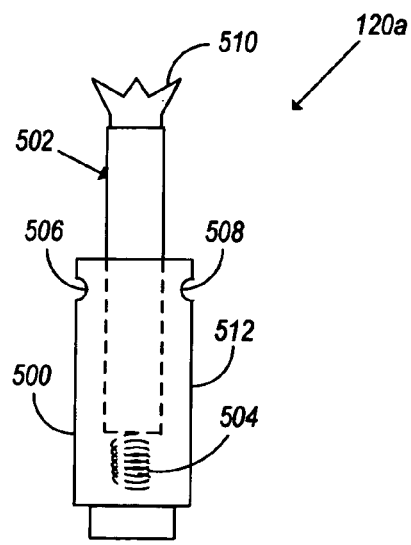
FIG. 5
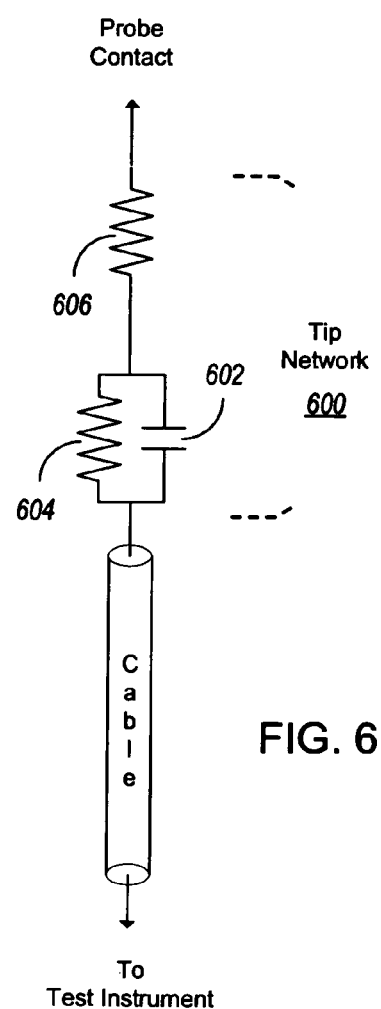
FIG. 6

INCORPORATION OF ISOLATION RESISTOR(S) INTO PROBES USING PROBE TIP SPRING PINS

BACKGROUND

Connector-less probing has emerged as an attractive form of probing for logic analyzers and other test equipment. In connector-less probing, a customer may design their printed circuit board (PCB) to incorporate a "landing pattern" of test points. The customer then attaches a connector-less probe to their test equipment, and mounts the connector-less probe to their PCB so that a plurality of spring-pins on the probe engage the plurality of test points in their PCB's landing pattern.

One embodiment of a connector-less probe is disclosed in the United States Patent Application of Brent A. Holcombe, et al. entitled "Connector-Less Probe" (Ser. No. 10/373,820, filed Feb. 25, 2003). An alignment/retention device for mounting a connector-less probe to a PCB is disclosed in the United States Patent Application of Brent A. Holcombe, et al. entitled "Alignment/Retention Device For Connector-Less Probe" (Ser. No. 10/644,365, filed Aug. 20, 2003).

Connector-less probes for probing a plurality of breakout vias on the backside of a printed circuit board to which a grid array package is attached are disclosed in the United States Patent Application of Brock J. LaMeres, et al. entitled "Backside Attach Probe, Components Thereof, and Methods for Making and Using Same" (Ser. No. 10/781,086, filed Jul. 28, 2004).

Agilent Technologies, Inc. (headquartered in Palo Alto, Calif.) markets a number of connector-less probing solutions under the name "Soft Touch".

SUMMARY

One aspect of the invention is embodied in a probe tip spring pin comprising a conductive sleeve and a plunger. The plunger is spring loaded within, and electrically coupled to, the conductive sleeve. The plunger comprises an isolation resistor.

Another aspect of the invention is embodied in a method for constructing a probe tip spring pin. The method comprises doping a ceramic material to give the material a resistivity sufficient to serve as an isolation resistor. A plunger is formed from the ceramic material, and is spring-loaded in a conductive sleeve. The spring-loading of the plunger electrically couples the plunger to the conductive sleeve.

Yet another aspect of the invention is embodied in alternate method for constructing a probe tip spring pin. The alternate method comprises constructing a plunger from first and second electrically coupled materials, at least a first of which has a resistivity sufficient to serve as an isolation resistor. The plunger is spring-loaded in a conductive sleeve, with the spring-loading serving to electrically couple the plunger to the conductive sleeve.

An additional aspect of the invention is embodied in a probe apparatus comprising a printed circuit board and a probe tip spring pin. The printed circuit board is provided with 1) first and second traces, 2) an isolation resistor that is embedded in at least one of the traces, 3) a via that electrically couples the first and second traces, and 4) upper and lower blind plated holes that respectively intersect the first and second traces. The probe tip spring pin is retained within the upper blind plated hole (and a fixed pin may be retained in the lower blind plated hole).

Other embodiments of the invention are also disclosed.

BRIEF DESCRIPTION OF THE DRAWINGS

Illustrative and presently preferred embodiments of the invention are illustrated in the drawings, in which:

FIG. 4 illustrates, in exploded form, various exemplary layers of the probe portion shown in FIG. 3;

FIG. 5 illustrates a first exemplary elevation of one of the probe tip spring pins shown in FIG. 1; and FIG. 6 illustrates an exemplary schematic of a probe tip network.

DESCRIPTION OF THE INVENTION

Figure 1:
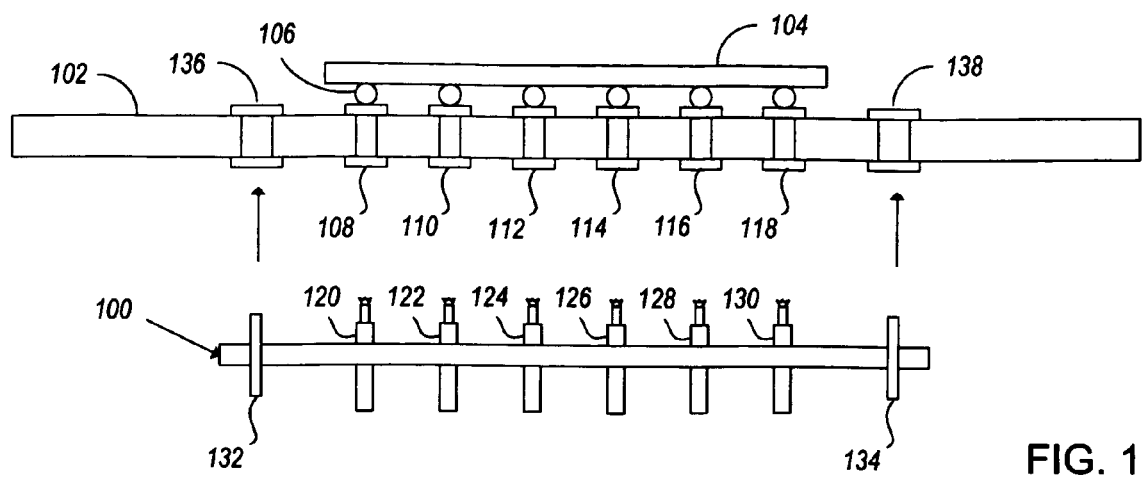
FIGS. 1 & 2 illustrate the coupling of an exemplary backside attach probe to a PCB.
Figure 2:
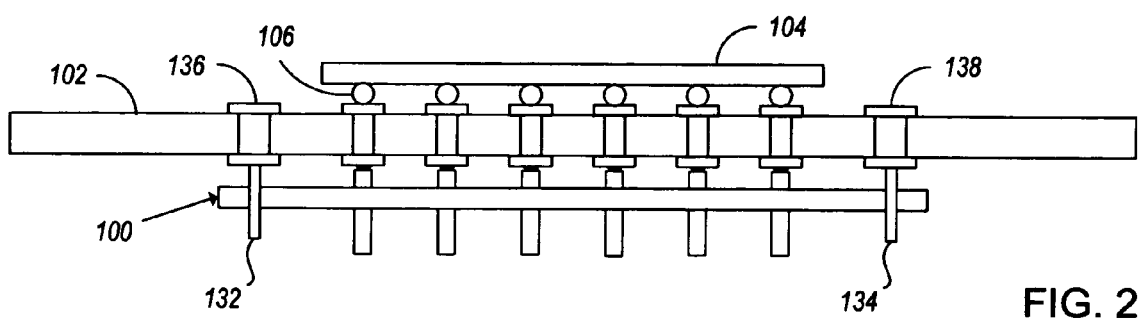

FIGS. 1 & 2 illustrate the coupling of an exemplary backside attach probe 100 to a printed circuit board (PCB) 102.

Attached to the PCB 102 is a grid array package 104. By way of example, and as shown in the figures, the package 104 may be a ball grid array (BGA) package. However, the package 104 could also take other forms (such as that of a land grid array (LGA) package).

The grid array package 104 is attached to the PCB 102 at a number of pads (e.g., pad 106) on one side of the PCB 102. The pads (e.g., 106) to which the package 104 is attached are coupled to a plurality of breakout vias 108, 110, 112, 114, 116, 118 that present on a side of the PCB 102 opposite the side of the PCB to which the package 104 is attached. For purposes of illustration, each of the breakout vias 108–118 is shown to be bounded above and below by a somewhat thick pad (e.g., pad 106). Typically, however, these pads will be very thin. Also, FIG. 1 shows that each of the breakout vias 108–118 is a through-hole type via. Although through-hole vias reduce the lengths of electrical paths between the package 104 and the probe 100, the vias 108–118 need not be through-hole vias, and could for example, traverse only some of the layers of the PCB 102. In this case, the breakout vias would not extend to package 104, and would instead be coupled to package 104 by means of internal traces and/or other vias of PCB 102. Also, if the breakout vias 108–118 are not through-hole type vias, they may not be vertically aligned with the contacts (e.g., solder balls) of package 104, as shown in FIG. 1.

As shown, the probe 100 may comprise a plurality of probe tip spring pins 120–130. The probe 100 may also comprise one or more mechanisms 132, 134 that may be used to mechanically couple the probe 100 to the PCB 102. As shown in FIG. 1, probe 100 comprises two such mechanisms 132, 134, and PCB 102 comprises two corresponding mechanisms 136, 138. However, the number of securing mechanisms 132–138 on the probe 100 and PCB 102 may vary. By way of example, the securing mechanisms 132, 134 of the probe 100 may be pop rivets, and the corresponding mechanisms 136, 138 of the PCB 102 may be through-holes.

To probe the grid array package 104, the probe 100 is first aligned with the plurality of breakout vias 108–118 (see FIG. 1). The probe 100 is then moved toward the PCB 102 until its probe tip spring pins 120–130 engage the PCB's breakout vias 108–118 (see FIG. 2). As the spring pins 120–130 engage the breakout vias 108–118, they apply pressure to the breakout vias 108–118, thereby ensuring good electrical connections with the breakout vias 120–130. At this point, the probe 100 may be mechanically coupled to the PCB 102 to keep the spring pins 120–130 engaged with the breakout vias 108–118. In some embodiments, movement of the probe 100 toward the PCB 102 may cause the securing mechanisms 132, 134 of the probe 100 to automatically engage their corresponding mechanisms 136, 138 on the PCB 102. In other embodiments, the securing mechanisms 132, 134 may require manual engagement.

Providing a probe 100 with probe tip spring pins makes the probe 100 more "user friendly" by giving some relief to its user. That is, the user can worry less that he/she is pressing too hard (and damaging the probe 100) or too soft (and not ensuring a good electrical connection between the probe 100 and breakout vias 108–118).

Figure 3:
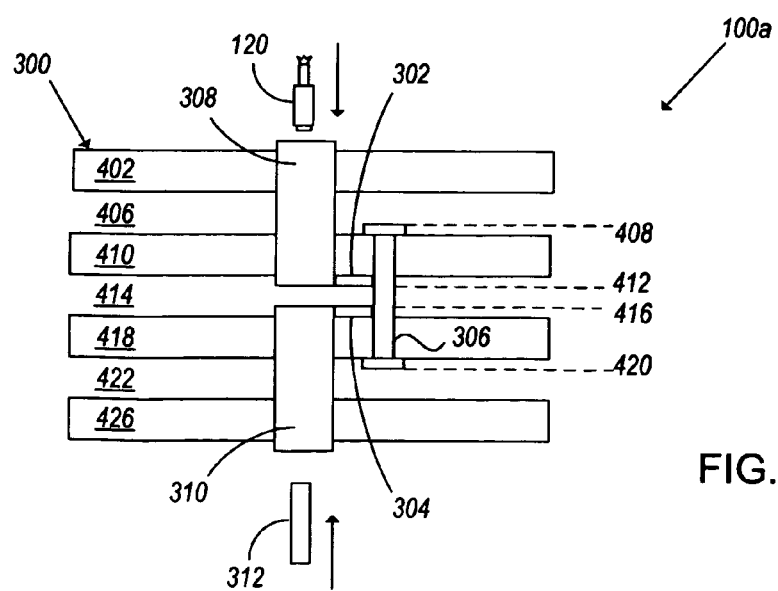
FIG. 3 illustrates a first exemplary construction of the backside attach probe shown in FIG. 1.

FIG. 3 illustrates a first exemplary construction of the probe 100. As shown, the probe 100a may comprise a PCB 300 having first and second circuit traces 302, 304 that are electrically coupled by a via 306. Preferably, and as shown, the traces 302, 304 are formed as inner traces, and the via 306 is formed as a buried via. Alternately, one or both of the traces 302, 304 could be formed as surface traces, and the via 306 could be formed as either a blind via (i.e., a via drilled from one side of the PCB 300) or a through-hole via. Depending on the types of traces and via employed, the traces and via may be formed prior to, or during, assembly of the various layers of the PCB 300. FIG. 4 illustrates, in exploded form, various exemplary layers 400–428 of the probe portion shown in FIG. 3. Note that the layers 400–428 comprise alternating signal and dielectric layers (with only some of these layers being specifically referenced in FIG. 3).

Referring again to FIG. 3, the PCB 300 of the probe 100a comprises upper and lower blind plated holes 308, 310 that respectively intersect the first and second traces 302, 304. In one embodiment, the blind plated holes 308, 310 are formed by drilling first and second holes into the PCB 300, and then spin-coating the surfaces of the holes with a conductive material.

After formation of the blind plated holes 308, 310, a probe tip spring pin 120 is inserted into the upper blind plated hole 308. The spring pin 120 may be retained within the hole 308 in a number of ways. For example, the hole 308 and spring pin 120 could be sized to enable press fitting of the spring pin 120. Alternately, the body of the spring pin 120 could be soldered (or otherwise conductively adhered) to the hole's plating, or to a conductive pad formed at the mouth of the hole 308.

To facilitate the attach of test instrument leads or cabling to the probe 100a, a fixed pin 312 may be inserted into the lower blind plated hole 310, and retained therein using any of the ways used to retain spring pin 120 in hole 308. Although FIG. 3 shows that the spring pin 120 and fixed pin 312 are aligned, this need not be the case. For example, the lower blind plated holes 310 of the probe 100a could be formed at a different pitch or in a different pattern than the probe's upper blind plated holes 308, thereby enabling the probe 100a to be coupled to a particular connector of a test instrument cable, or providing more spacing between the lower blind plated holes 310 so that a user can more easily probe individual ones of a grid array package's signals. In alternate embodiments of the probe 100a, something other than a fixed pin may be inserted in the probe's lower holes 310.

FIG. 5 illustrates a first exemplary elevation of one of the probe tip spring pins 120 shown in FIGS. 1–3. By way of example, the probe tip spring pin 120a comprises a conductive sleeve 500, a plunger 502, and a spring 504. The spring 504 and plunger 502 are inserted into and mechanically retained in the sleeve 500 (e.g., by detents 506, 508 created after the plunger 502 is inserted into the sleeve 500), with the spring biasing the plunger 502 with respect to the sleeve 500. Optionally, the plunger 502 may be provided with a crown tip 510. In one embodiment, the crown tip 510 is an integral extension of the plunger's body. In another embodiment, the crown tip 510 is soldered or otherwise bonded to the plunger's body.

The components of the probe tip spring pin 120a may be formed from various metallic or composite materials. However, all of the components 500–504 are conductive so that a conductive path is formed between the tip 510 of the plunger 502 and the sleeve 500. Although the crown tip 510 shown in FIG. 5 is outwardly flared, it need not be.

Although the probe 100 (possibly constructed as probe 100a) may be provided to a user pre-assembled, it may also be provided to a user in kit form. That is, a user may be provided with a PCB 300 (constructed as shown), a plurality of spring pins (e.g., spring pins 120a), and the mechanism 132, 134 that is used to mechanically couple the probe 100 to the PCB 102. Preferably, the securing mechanism 132, 134 is pre-assembled to the PCB 300.

So long as the breakout vias 108–118 of a PCB 100 are provided at the same pitch as the upper holes 308 of the probe 100, the user may configure the probe 100 of a kit by inserting probe tip spring pins 120 into holes 308 that are selected to match the layout of the breakout vias 108–118.

As shown in FIG. 6, the probes or leads of modern test instruments typically comprise a tip network 600. The tip network 600 usually comprises a tip capacitor 602 and tip resistor 604 that form a compensated resistive-divider circuit with the termination impedance of a test instrument. The electrical loading on signals being probed can be reduced by placing the tip network 600 as close as possible to a target signal (i.e., a signal being probed). Placing the tip network 600 closer to a target signal also increases the quality of signals that are sensed by a test instrument (e.g., by reducing signal reflections and "ringing"). However, spatial and capacitive loading problems often make it difficult to place the tip capacitor 602 and tip resistor 604 (which is often on the order of 20 k$\Omega$) as close to the target signal as desired. As a result, the tip network 600 will sometimes also comprise an isolation resistor 606. The value of this isolation resistor 606 may be on the order of 125$\Omega$. Being of smaller size than the tip resistor 604, and being one component instead of two, the isolation resistor 606 can often be placed much closer to a target signal than the tip capacitor 602 and tip resistor 604.

Referring back to FIG. 3, one aspect of the invention comprises embedding an isolation resistor 606 in at least one of the traces 302, 304 of the PCB 300. Although the isolation resistor 606 may be embedded in either of the traces 302, 304, or may be distributed across the traces 302, 304 (e.g., as a combination of two series resistors), it is preferable that the isolation resistor 606 be embedded in the trace 302 that is closest to the probe tip spring pin 120. As stated above, the closer an isolation resistor 606 can be placed to the point of probing, the greater the benefit to both 1) the device being probed, and 2) the test instrument receiving probed signals.

By way of example, the value of an isolation resistor 606 embedded in trace 302 may be controlled by choosing an appropriate metal and/or dimensions for trace 302. For flying lead logic analyzers manufactured by Agilent Technologies, Inc., useful values for the isolation resistor 606 are believed to be values greater than 100$\Omega$, with values from 100–200$\Omega$ being preferable, and a value of 125$\Omega$ being ideal. Although these values may also be used in conjunction with other test instruments, the value of the isolation resistor 606 may, in some circumstances, assume other values.

Another aspect of the invention comprises incorporating an isolation resistor 606 into the plunger of a probe tip spring pin. One way to do this is to construct a plunger from first and second electrically coupled materials, with at least one of the materials having a resistivity that is sufficient to serve as the isolation resistor 606. The remaining portion of the plunger may contribute to the value of the isolation resistor 606, or may be a low resistivity conductor. By way of example, the two materials of the plunger may be electrically coupled using solder or a conductive adhesive.

Referring to the probe tip spring pin 120a shown in FIG. 5, the two electrically coupled materials of the plunger 502 may be the crowned probe tip 510 and body 512 of the plunger. Fabricating the crowned probe tip 510 to serve as the isolation resistor 606 would be ideal, but the irregular shape of the crown tip 510 makes it more difficult to precisely control its resistivity. Alternately, the body 512 of the plunger 502 could be fabricated to serve as the isolation resistor 606. Given that the plunger body 512 shown in FIG. 5 is cylindrical, it may be easy to control its impedance.

The plunger 502 of a probe tip spring pin 120a could also be formed of two electrically coupled materials by dipping one in the other. Thus, for example, the plunger 502 (FIG. 5) could be manufactured as a whole (or assembled into a whole) and then dipped in a resistive fluid that coats the probe tip 510 of the plunger 502. By way of example, the material into which the plunger 502 is dipped could be a thick film ink.

Another way to incorporate an isolation resistor 606 into the plunger 502 of a probe tip spring pin 120a is to dope a ceramic material to give the material a resistivity that is sufficient to serve as an isolation resistor. The plunger 502 may then be cut, stamped, shaped, or otherwise formed from the doped ceramic material. Alternately, only the portion of the plunger 502 that serves as the isolation resistor 606 (e.g., the body 512 of the plunger 502) could be formed from the doped ceramic, and the isolation resistor could then be electrically coupled to another portion of the plunger 502 (e.g., the crown tip 510).

It should be noted that spring pin plungers incorporating isolation resistors could be used in conjunction with the probes 100, 100a shown in FIGS. 1–3, or in any other probe using spring pins (such as those disclosed in United States Patent Application of Brent A. Holcombe, et al. entitled "Connector-Less Probe" (Ser. No. 10/373,820, filed Feb. 25, 2003), or those disclosed in United States Patent Application of Brock J. LaMeres, et al. entitled "Probes with Perpendicularly Disposed Spring Pins, and Methods of Making and Using Same" Ser. No. 10/781,086, filed on Feb. 17, 2004.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A probe apparatus, comprising:
   a printed circuit board having first and second traces, an isolation resistor embedded in at least one of the traces, a via that electrically couples the first and second traces, and upper and lower blind plated holes that respectively intersect the first and second traces; and
   a probe tip spring pin retained within the upper blind plated hole.

2. The apparatus of claim 1, wherein the isolation resistor has a value of at least 100Ω.

3. The apparatus of claim 1, wherein the isolation resistor has a value of 100–200Ω.

4. The apparatus of claim 1, wherein the first and second traces are inner traces of the printed circuit board, and wherein the via is a buried via in the printed circuit board.

5. The apparatus of claim 1, wherein the isolation resistor is embedded in the trace that intersects the upper blind plated hole.

6. The apparatus of claim 1, further comprising a fixed pin retained within the lower blind plated hole.

7. The apparatus of claim 1, wherein the probe tip spring pin comprises:
   a conductive sleeve; and
   a plunger, spring loaded within and electrically coupled to the conductive sleeve.

8. The apparatus of claim 7, wherein the plunger comprises a crowned probe tip.

9. The apparatus of claim 8, wherein the crowned probe tip is flared outward, away from a center axis of the probe tip spring pin.

* * * * *